(12) United States Patent
Hikosaka et al.

(10) Patent No.: US 9,263,631 B2
(45) Date of Patent: Feb. 16, 2016

(54) SEMICONDUCTOR LIGHT EMITTING DEVICE AND METHOD FOR MANUFACTURING SAME

(71) Applicant: KABUSHIKI KAISHA TOSHIBA, Tokyo (JP)

(72) Inventors: Toshiki Hikosaka, Tokyo (JP); Koichi Tachibana, Kanagawa-ken (JP); Hajime Nago, Kanagawa-ken (JP); Shinya Nunoue, Chiba-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 9 days.

(21) Appl. No.: 14/446,929

(22) Filed: Jul. 30, 2014

(65) Prior Publication Data
US 2014/0339500 A1   Nov. 20, 2014

Related U.S. Application Data (60) Division of application No. 14/091,799, filed on Nov. 27, 2013, now Pat. No. 8,835,904, which is a division of application No. 13/222,500, filed on Aug. 31, 2011, now Pat. No. 8,680,508, which is a continuation of application No. PCT/JP2009/065260, filed on Sep. 1, 2009.

(51) Int. Cl.
*H01L 21/00* (2006.01)
*H01L 33/06* (2010.01)
(Continued)

(52) U.S. Cl.
CPC ............... *H01L 33/06* (2013.01); *B82Y 20/00* (2013.01); *H01L 33/0075* (2013.01); *H01S 5/305* (2013.01); *H01S 5/3407* (2013.01); *H01S 5/34333* (2013.01); *H01L 33/32* (2013.01)

(58) Field of Classification Search
CPC . H01L 33/06; H01L 29/2003; H01L 33/0075; H01L 33/32; H01L 29/207; H01S 5/343
USPC ............... 438/604, 45; 257/14, 94, E29.093, 257/E33.008
See application file for complete search history.

(56) References Cited

U.S. PATENT DOCUMENTS 7,183,584 B2   2/2007 Futagawa
7,547,909 B2   6/2009 Park
(Continued)

FOREIGN PATENT DOCUMENTS

JP   2000-277868   10/2000
JP   2000-332364   11/2000
(Continued)

OTHER PUBLICATIONS

International Search Report issued Oct. 6, 2009 in PCT/JP2009/065260 filed Sep. 1, 2009.
(Continued)

*Primary Examiner* — Jarrett Stark
(74) *Attorney, Agent, or Firm* — Oblon, McClelland, Maier & Neustadt, L.L.P.

(57) ABSTRACT

According to one embodiment, a semiconductor light emitting device includes an n-type layer, a p-type layer, and a light emitting unit provided between the n-type layer and the p-type layer and including barrier layers and well layers. At least one of the barrier layers includes first and second portion layers. The first portion layer is disposed on a side of the n-type layer. The second portion layer is disposed on a side of the p-type layer, and contains n-type impurity with a concentration higher than that in the first portion layer. At least one of the well layers includes third and fourth portion layers. The third portion layer is disposed on a side of the n-type layer. The fourth portion layer is disposed on a side of the p-type layer, and contains n-type impurity with a concentration higher than that in the third portion layer.

19 Claims, 8 Drawing Sheets

(51) Int. Cl.
*B82Y 20/00* (2011.01)
*H01S 5/30* (2006.01)
*H01S 5/34* (2006.01)
*H01S 5/343* (2006.01)
*H01L 33/00* (2010.01)
*H01L 33/32* (2010.01)

(56) References Cited

U.S. PATENT DOCUMENTS

| | | |
|---|---|---|
| 8,324,611 B2 | 12/2012 | Kaneko et al. |
| 8,399,896 B2 | 3/2013 | Hikosaka et al. |
| 2010/0187497 A1 | 7/2010 | Nago et al. |
| 2011/0187294 A1 | 8/2011 | Bergmann et al. |

FOREIGN PATENT DOCUMENTS

| | | |
|---|---|---|
| JP | 2003-229645 | 8/2003 |
| WO | WO 2004/047245 | 6/2004 |

OTHER PUBLICATIONS

Office Action issued in corresponding Japanese patent application No. 2012-245828 dated Oct. 1, 2013 with English translation.

FIG. 10

SEMICONDUCTOR LIGHT EMITTING DEVICE AND METHOD FOR MANUFACTURING SAME

CROSS-REFERENCE TO RELATED APPLICATIONS

This application is a divisional of application Ser. No. 14/091,799, filed on Nov. 27, 2013, which is a divisional of application Ser. No. 13/222,500, filed on Aug. 31, 2011, which is a continuation of International Application PCT/JP2009/065260, filed on Sep. 1, 2009; the entire contents of which are incorporated herein by reference.

FIELD

Embodiments described herein relate generally to a semiconductor light emitting device, a method for manufacturing a semiconductor light emitting device.

BACKGROUND

In a light emitting device which has a quantum well structure using a nitride semiconductor, a polarization electric field is generated inside the quantum well structure due to symmetrical property of a crystal structure of a nitride crystal and crystal strain, and carriers in the quantum well are separated spatially, which causes decrease in luminous efficiency and increase in a driving voltage.

Hence, in Patent Document 1, for the purpose of suppressing an influence of a piezo electric field, there is proposed a configuration which provides an n-type region doped with an n-type impurity and an undoped region in a barrier layer. However, even in the case of using this technology, the luminous efficiency is insufficient, and there is a room for improvement.

DETAILED DESCRIPTION

In general, according to one embodiment, a semiconductor light emitting device includes an n-type layer, a p-type layer, and a light emitting unit. The n-type layer includes a nitride semiconductor. The p-type layer includes a nitride semiconductor. The light emitting unit is provided between the n-type layer and the p-type layer and includes a plurality of barrier layers and a plurality of well layers. The plurality of barrier layers includes a nitride semiconductor. Each of the well layers is provided between the barrier layers, has a bandgap energy smaller than a bandgap energy of the barrier layers, and includes a nitride semiconductor. At least one of the barrier layers includes a first portion layer and a second portion layer. The first portion layer is disposed on a side of the n-type layer. The second portion layer is disposed on a side of the p-type layer, and contains an n-type impurity with a concentration higher than an n-type impurity concentration in the first portion layer. At least one of the well layers includes a third portion layer and a fourth portion layer. The third portion layer is disposed on a side of the n-type layer. The fourth portion layer is disposed on a side of the p-type layer, and contains the n-type impurity with a concentration higher than an n-type impurity concentration in the third portion layer.

According to another embodiment, a method for manufacturing a semiconductor light emitting device is disclosed. The device includes: an n-type layer including a nitride semiconductor, a p-type layer including a nitride semiconductor, and a light emitting unit provided between the n-type layer and the p-type layer. The light emitting unit includes: a plurality of barrier layers including a nitride semiconductor, and a plurality of well layers, each of the well layers being provided between the barrier layers, having a bandgap energy smaller than a bandgap energy of the barrier layers and including a nitride semiconductor. The method can form one of the barrier layer on the n-type layer using gas including group III raw material gas and group V raw material gas by forming a first portion layer serving as a portion of the one of the barrier layer and forming a second portion layer on the first portion layer. The second portion layer serves as another portion of the one of the barrier layer and contains an n-type impurity with a concentration higher than an n-type impurity concentration in the first portion layer. In addition, the method can form one of the well layer on the one of the barrier layers using gas including group III raw material gas and group V raw material gas by forming a third portion layer serving as a portion of the one of the well layer and forming a fourth portion layer on the third portion layer. The fourth portion layer serves as another portion of the one of the well layer and contains the n-type impurity with a concentration higher than an n-type impurity concentration in the third portion layer.

Exemplary embodiments of the invention will now be described in detail with reference to the drawings.

The drawings are schematic or conceptual; and the relationships between the thickness and width of portions, the proportions of sizes among portions, etc., are not necessarily the same as the actual values thereof. Further, the dimensions and proportions may be illustrated differently among the drawings, even for identical portions.

In the specification and the drawings of the application, components similar to those described in regard to a drawing thereinabove are marked with like reference numerals, and a detailed description is omitted as appropriate.

Figure 1A:
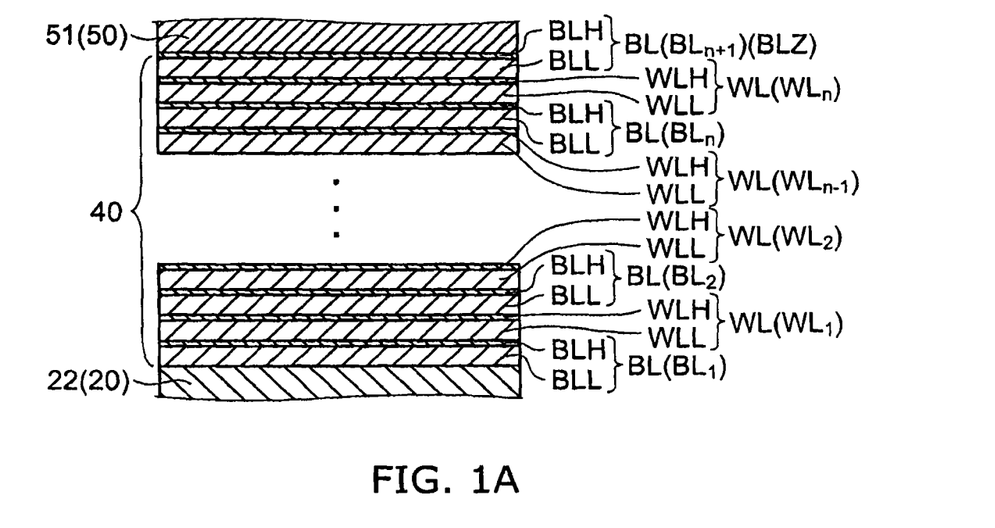
FIG. 1A and FIG. 1B are schematic sectional views showing a configuration of a semiconductor light emitting device according to the embodiment.
Figure 1B:
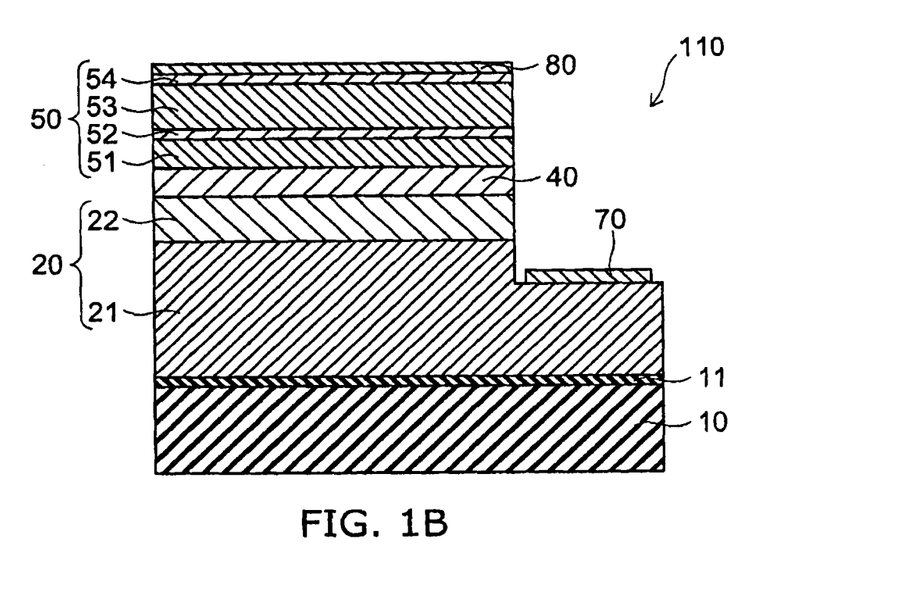

FIG. 1A and FIG. 1B are schematic sectional views which illustrate a configuration of a semiconductor light emitting device according to the embodiment.

FIG. 1B illustrates a whole configuration of the semiconductor light emitting device, and FIG. 1A illustrates a configuration of a light emitting unit of the semiconductor light emitting device.

As shown in the FIG. 1B, a semiconductor light emitting device 110 according to the embodiment includes an n-type layer 20, a p-type layer 50 and a light emitting unit 40 provided between the n-type layer 20 and the p-type layer 50.

The n-type layer 20 and the p-type layer 50 include a nitride semiconductor. For example, the n-type layer 20 and the p-type layer 50 are composed of nitride semiconductors.

As shown in FIG. 1A, the light emitting unit 40 has a plurality of barrier layers BL and a plurality of well layers WL, each of the well layers being provided between the plurality of barrier layers.

The barrier layer BL and the well layer WL include a nitride semiconductor. For example, the barrier layer BL and the well layer WL are composed of nitride semiconductors. In the well layer WL, a nitride semiconductor containing at least indium (In) may be used. Bandgap energy of the barrier layer BL is larger than that of the well layer WL.

When the barrier layer BL contains In, the concentration of In in the barrier layer BL is lower than that of In in the well layer WL. Thereby, the bandgap energy in the well layer WL becomes smaller than that in the barrier layer BL.

In this way, the barrier layers BL and the well layers WL are stacked alternately each other. Here, when the number of well layers WL is set to "n", the well layers WL have a first well layer $WL_1$ to an n-th well layer $WL_n$. The barrier layers BL includes a first barrier layer $BL_1$ to (n+1)-th barrier layer $BL_{n+1}$. Here, the barrier layer BL ((n+1)-th barrier layer $BL_{n+1}$) nearest to the p-type layer 50 is appropriately referred to as a "final barrier layer BLZ."

As shown in FIG. 1A, each of the barrier layers BL includes a first portion layer BLL which is provided on the side of the n-type layer 20 and having a low n-type impurity concentration, and a second portion layer BLH which is provided on the side of the p-type layer 50 and contains n-type impurities with a concentration higher than the n-type impurity concentration in the first portion layer BLL. The first portion layer BLL is a portion of the barrier layer BL, the portion being on the side of the n-type layer 20. The second portion layer BLH is a portion of the barrier layer BL, the portion being on the side of the p-type layer 50. Each of the well layers WL includes a third portion layer WLL which is provided on the side of the n-type layer 20 and having a low n-type impurity concentration, and a fourth portion layer WLH which is provided on the side of the p-type layer 50 and contains n-type impurities with a concentration higher than the n-type impurity concentration in the third portion layer WLL. The third portion layer WLL is a portion of the well layer WL, the portion being on the side of the n-type layer 20. The fourth portion layer WLH is a portion of the well layer WL, the portion being on the side of the p-type layer 50.

For example, the first portion layer BLL is provided in contact with an interface on the side of the n-type layer 20 of interfaces between the barrier layer BL and the well layer WL. For example, the second portion layer BLH is provided in contact with the interface on the side of the p-type layer 50 of the interfaces between the barrier layer BL and the well layer WL. For example, the third portion layer WLL is provided in contact with the interface on the side of the n-type layer 20 of the interfaces between the barrier layer BL and the well layer WL. For example, the fourth portion layer WLH is provided in contact with the interface on the side of the p-type layer 50 of the interfaces between the barrier layer BL and the well layer WL.

However, as described later, at least one of the barrier layers BL may include the first portion layer BLL and second portion layer BLH described above, and at least one of the well layers WL may include the third portion layer WLL and fourth portion layer WLH described above.

In this way, the semiconductor light emitting device 110 has a configuration where the barrier layer BL includes the first portion layer BLL and the second portion layer BLH, and the well layer WL includes the third portion layer WLL and the fourth portion layer WLH. Thereby, spacial separateness of carriers in the light emitting unit 40 is suppressed, and controllability of the impurity becomes better, and it is possible to obtain a semiconductor light emitting device having high crystalline quality and high luminous efficiency.

Hereinafter, a specific configuration of the semiconductor light emitting device 110 will be described. The semiconductor light emitting device 110 of the specific example is a light emitting diode (LED: Light Emitting Diode).

As shown in the FIG. 1B, in the semiconductor light emitting device 110, a buffer layer 11 is provided on the major surface of a sapphire substrate 10, and an n-type GaN layer 21 and an n-type GaN guide layer 22 are provided thereon. The n-type GaN layer 21 and the n-type GaN guide layer 22 are included in the n-type layer 20.

Then, an active layer (light emitting unit 40) is provided on the n-type GaN guide layer 22, and a p-type GaN first guide layer 51, a p-type AlGaN layer 52 (electron overflow preventing layer), a p-type GaN second guide layer 53, and a p-type GaN contact layer 54 are provided thereon in this order. The p-type GaN first guide layer 51, the p-type AlGaN layer 52, the p-type GaN second guide layer 53, and the p-type GaN contact layer 54 are included in the p-type layer 50.

Then, a part of the n-type GaN layer 21 of the n-type layer 20, and the light emitting unit 40 and the p-type layer 50 corresponding to the part, are removed, and a n-side electrode 70 is provided on the n-type GaN layer 21. On the other hand, a p-side electrode 80 is provided on the p-type GaN contact layer 54.

An example of a method for manufacturing the semiconductor light emitting device 110 will be described.

First, after the formation of the buffer layer 11 on the major surface of the sapphire substrate 10, the n-type GaN layer 21 is crystal-grown. Metal-organic chemical vapor deposition (MOCVD) is used for the crystal growth, for example. Further, the crystal growth may be performed with a molecular beam epitaxy (MBE). Si is used as an n-type impurity to be doped into the n-type GaN layer 21. However, further, it is possible to use various elements, such as Ge and Sn. A doping concentration of Si in the n-type GaN layer 21 is made to be approximately $2\times10^{18}$ $cm^{-3}$, for example, and a thickness of the n-type GaN layer 21 is made to be 4 μm (micrometer), for example.

Various kinds of materials other than sapphire, such as GaN, SiC, Si, and GaAs, can be used for the substrate 10.

Next, the n-type GaN guide layer 22 is crystal-grown on the n-type GaN layer 21. An n-type impurity concentration in the n-type GaN guide layer 22 is made to be approximately $1\times10^{18}$ $cm^{-3}$, for example, and a thickness of the n-type GaN guide layer 22 is made to be 0.1 μm, for example.

Each growth temperature at the time of growing the n-type GaN layer 21 and n-type GaN guide layer 22 is not less than 1000° C. and not more than 1100° C.

As the n-type GaN guide layer 22, $In_{0.01}Ga_{0.99}N$ whose thickness is approximately 0.1 μm may be used instead of the GaN layer. A growth temperature in the case of using $In_{0.01}Ga_{0.99}N$ is not less than 700° C. and not more than 800° C.

Next, the light emitting unit 40 is formed on the n-type GaN guide layer 22.

For example, the first barrier layer $BL_1$ as the first order layer is formed. At this time, at the beginning, the first portion layer BLL which has a low n-type impurity concentration, that is undoped for example, is formed. For the first portion layer BLL, the undoped $In_{0.02}Ga_{0.98}N$ is used, for example, and a thickness thereof is made to be 10.5 nm. Even in the undoped $In_{0.02}Ga_{0.98}N$, an n-type impurity is slightly contained, and therefore, an n-type impurity concentration in the first portion layer BLL of the undoped $In_{0.02}Ga_{0.98}N$ is not less than $1\times10^{16}$ cm$^{-3}$ and not more than $1\times10^{17}$ cm$^{-3}$.

After that, on the first portion layer BLL, the second portion layer BLH containing n-type impurities with a concentration higher than the n-type impurity concentration in the first portion layer BLL is formed. For the second portion layer BLH, $In_{0.02}Ga_{0.98}N$ with Si doped is used, for example, and a thickness thereof is made to be 2 nm. Then, Si concentration in the second portion layer BLH is made to be not less than $5\times10^{17}$ cm$^{-3}$ and not more than $1\times10^{19}$ cm$^{-3}$, for example.

Thereby, the thickness of the barrier layer BL will become 12.5 nm. In this way, the thickness of the second portion layer BLH (2 nm in this example) is set to be thinner than the thickness (10.5 nm in this example) of the first portion layer BLL.

The barrier layer BL can have a plurality of bandgap energies larger than the well layer WL. For example, the first portion layer BLL and the second portion layer BLH may have bandgap energies which are different from each other, and the bandgap energies in the first portion layer BLL and the second portion layer BLH may be changing in an inclined manner, in a graded manner, or in a step-wise manner.

After that, the first well layer $WL_1$ of the first portion layer is formed on the second portion layer BLH. At this time, at the beginning, the third portion layer WLL is formed which has a low n-type impurity concentration, that is undoped, for example. For the third portion layer WLL, undoped $In_{0.2}Ga_{0.8}N$ is used, for example, and a thickness thereof is made to be 1.5 nm. Even in the undoped $In_{0.2}Ga_{0.8}N$, an n-type impurity is slightly contained, and therefore, an n-type impurity concentration in the third portion layer WLL of the undoped $In_{0.2}Ga_{0.8}N$ is not less than $1\times10^{16}$ cm$^{-3}$ and not more than $1\times10^{17}$ cm$^{-3}$.

After that, on the third portion layer WLL, the fourth portion layer WLH is formed which contains n-type impurities with a concentration higher than that n-type impurity concentration in the third portion layer WLL. For the fourth portion layer WLH, $In_{0.2}Ga_{0.8}N$ with Si doped is used, for example, and a thickness thereof is made to be 1 nm. Then, Si concentration in the fourth portion layer WLH is made to be not less than $5\times10^{17}$ cm$^{-3}$ and not more than $1\times10^{19}$ cm$^{-3}$, for example.

Thereby, the thickness of the well layer WL will become 2.5 nm. In this way, the thickness of the fourth portion layer WLH (1 nm in this example) is set to be thinner than the thickness (1.5 nm in this example) of the third portion layer WLL.

After that, similarly, the barrier layers BL (the second barrier layer $BL_2$ to the (n+1)-th barrier layer $BL_{n+1}$) and the well layers WL (the second well layer $WL_2$ to the n-th well layer $WL_n$) are formed repeatedly and alternately. Thereby, the light emitting unit 40 having a multiple quantum well (MQW) structure is formed in which the barrier layers BL and the well layers WL are stacked alternately.

A growth temperature in forming the barrier layers BL and well layers WL (the first portion layer BLL, the second portion layer BLH, the third portion layer WLL, and the fourth portion layer WLH) is not less than 700° C. and not more than 800° C., for example. The barrier layer BL and well layer WL described above have been designed so that a wavelength of photoluminescence of the light emitting unit 40 in a room temperature becomes 450 nm.

Next, the p-type GaN first guide layer 51 of GaN is grown on the light emitting unit 40. A thickness of the p-type GaN first guide layer 51 is approximately 30 nm, for example. A temperature of growing the GaN layer serving as the p-type GaN first guide layer 51 is not less than 1000° C. and not more than 1100° C., for example. As a p-type impurity used at this time, Mg is used. However, further, it is possible to use various elements such as Zn and C. A doping concentration of Mg is made to be approximately $4\times10^{18}$ cm$^{-3}$, for example. As the p-type GaN first guide layer 51, $In_{0.01}Ga_{0.99}N$ having a thickness of approximately 30 nm may be used. A growth temperature in the case of using $In_{0.01}Ga_{0.99}N$ is not less than 700° C. and not more than 800° C., for example.

Next, a p-type AlGaN layer 52 is formed on the p-type GaN first guide layer 51. For the p-type AlGaN layer 52, $Al_{0.2}Ga_{0.8}N$ with a p-type impurity doped can be used. The p-type AlGaN layer 52 has a function of an electron overflow preventing layer. As the p-type impurity, Mg is used, and a concentration of Mg is made to be $1\times10^{19}$ cm$^{-3}$ approximately, for example. A growth temperature of $Al_{0.2}Ga_{0.8}N$ serving as the p-type AlGaN layer 52 is not less than 1000° C. and not more than 1100° C., for example.

Next, a p-type GaN second guide layer 53 is formed on the p-type AlGaN layer 52. For the p-type GaN second guide layer 53, a p-type GaN layer with Mg doped can be used. A thickness of the p-type GaN second guide layer 53 is approximately 50 nm, for example. Mg can be used as a p-type impurity, and a concentration of Mg is made to be $1\times10^{19}$ cm$^{-3}$ approximately, for example. The growth temperature of GaN serving as the p-type GaN second guide layer 53 is not less than 1000° C. and not more than 1100° C., for example.

Then, a p-type GaN contact layer 54 is formed on the p-type GaN second guide layer 53. In the p-type GaN contact layer 54, Mg can be used as a p-type impurity. A concentration of Mg is made to be $1\times10^{20}$ cm$^{-3}$ approximately, for example. A thickness of the p-type GaN contact layer 54 is approximately 60 nm, for example.

For such a stacked structure body where a crystal growth of each layer has been performed, the following device processes are performed.

The p-side electrode 80 is formed on the p-type GaN contact layer 54. For the p-side electrode 80, a composite film of palladium-platinum-gold (Pd/Pt/Au) is used, for example. For example, a thickness of a Pd film is 0.05 μm, a thickness of a Pt film is 0.05 μm, and a thickness of an Au film is 0.05 μm. However, it is possible to use a transparent electrode such as an indium-tin-oxide (ITO) or a metal having a high reflectivity.

Then, a dry etching is carried out to a part of the stacked structure body described above, the n-type GaN layer 21 is made to be exposed, and an n-side electrode 70 is formed. As the n-side electrode 70, a composite film of titanium-platinum-gold (Ti/Pt/Au) is used, for example. For example, a thickness of a Ti film is 0.05 μm approximately, a thickness of a Pt film is 0.05 μm approximately, and a thickness of Au film is 1.0 μm approximately. Thereby, the semiconductor light emitting device 110 illustrated in FIG. 1 is fabricated.

Hereinafter, characteristics of the semiconductor light emitting device 110 are described, referring to reference examples.

FIG. 2A to FIG. 2F and FIG. 3A to FIG. 3E are schematic views illustrating configurations of the semiconductor light emitting device according to the embodiment and the semiconductor light emitting devices of reference examples.

Figure 2A:
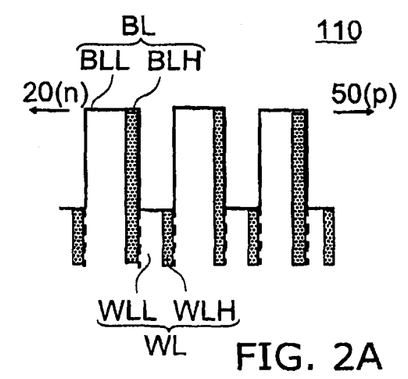
FIG. 2A to FIG. 2F are schematic views showing configurations of the semiconductor light emitting device according to the embodiment and the semiconductor light emitting devices of reference examples.

These figures show exemplarily an energy band of a conduction band in a light emitting unit of a semiconductor light emitting device, and an arrangement of a high concentration impurity layer. FIG. 2A corresponds to the semiconductor light emitting device 110 according to the embodiment, and FIG. 2B to FIG. 2F, and FIG. 3A to FIG. 3E correspond to semiconductor light emitting devices 191 to 200 of the first to the 10th reference examples.

As shown in FIG. 2A, in the semiconductor light emitting device 110 according to the embodiment, the second portion layer BLH containing high concentration n-type impurities is disposed on the side of the p-type layer 50 of each barrier layer BL, and at the same time, the fourth portion layer WLH containing high concentration n-type impurities is disposed on the side of the p-type layer 50 of each well layer WL. Thereby, an influence of an electric field inside the light emitting unit 40 is suppressed, and luminescent efficiency can be improved. That is, a driving voltage is reduced and luminous efficiency is improved.

Furthermore, in this structure, as the barrier layer BL, after forming the first portion layer BLL which has low concentration impurities (undoped, for example), the second portion layer BLH of a high concentration is formed, and after that, as the well layer WL, the third portion layer WLL which has low concentration impurities (undoped, for example) is formed, and after that, the fourth portion layer WLH of a high concentration is formed.

At this time, after switching from the barrier layer BL to the well layer WL, for forming the well layer WL, the crystal growth of the third portion layer WLL having a low concentration is started, and thereafter, the crystal growth of the fourth portion layer WLH of a high concentration is performed. This makes an influence of residual impurities in a reacting chamber to be suppressed. Thereby, controllability of the impurity concentration is improved and crystalline quality is improved. That is, in the interface between the third portion layer WLL and the fourth portion layer WLH, steepness of control of the impurity concentration is improved.

Then, after switching from the well layer WL to the barrier layer BL, for forming the barrier layer BL, the crystal growth of the first portion layer BLL having a low concentration is started, and after that, the crystal growth of the second portion layer BLH of a high concentration is performed. Thereby, the controllability of the impurity concentration is improved, and the crystalline quality is improved. That is, in the interface between the first portion layer BLL and the second portion layer BLH, the steepness of control of the impurity concentration is improved.

In manufacturing of the semiconductor light emitting device 110, in order to obtain a good crystal, the n-type layer 20 is formed, and after that, the light emitting unit 40 is formed, and after that, the p-type layer 50 is formed. In forming the light emitting unit 40 like this, in the case of the switching from the barrier layer BL to the well layer WL, and the switching from the well layer WL to the barrier layer BL, as described later, a method of interrupting supply of a part of material gas to be the barrier layer BL or the well layer WL, and supplying only nitrogen material gas, for example, can be applied, and the controllability of the impurity concentration and material composition is improved, and a crystal having good crystalline quality is obtained.

In this way, in the case of the switching from the barrier layer BL to the well layer WL, and the switching from the well layer WL to the barrier layer BL, by starting the crystal growth of the third portion layer WLL of a low concentration or the first portion layer BLL of a low concentration, the crystalline quality of the well layer WL and the barrier layer BL is improved, and the steepness of change of the impurity concentration and material composition between the well layer WL and the barrier layer BL can also be improved.

In this configuration, the second portion layer BLH and fourth portion layer WLH each of which is an impurity region having a high concentration are formed after the first portion layer BLL and third portion layer WLL each of which is undoped, respectively, and therefore, the barrier layer and well layer having a high carrier concentration and a high mobility can be obtained with good crystalline quality maintained.

Then, internal electric fields generated in the barrier layer BL and well layer WL can be efficiently suppressed by the carriers generated from impurities inside the second portion layer BLH and the fourth portion layer WLH which are the impurity regions having the high concentration. Thereby, the luminous efficiency can be improved and an optical output power can be improved.

As described above, in the semiconductor light emitting device 110 according to the embodiment, the barrier layer BL and the well layer WL include the second portion layer BLH and fourth portion layer WLH containing high concentration impurities respectively, and thereby, the electric field is suppressed, and furthermore, by the configuration in which the second portion layer BLH and the fourth portion layer WLH are formed after the first portion layer BLL and third portion layer WLL containing low concentration impurities, respectively, the high crystalline quality is maintained. Thereby, the luminous efficiency can be improved with the driving voltage being reduced.

In the semiconductor light emitting device 110, the concentration of the n-type impurity in the second portion layer BLH is not less than $5 \times 10^{17}$ cm$^{-3}$ and not more than $1 \times 10^{19}$ cm$^{-3}$ preferably, and is not less than $1 \times 10^{18}$ cm$^{-3}$ and not more than $5 \times 10^{18}$ cm$^{-3}$ more preferably. By making the concentration of the n-type impurity not less than $5 \times 10^{17}$ cm$^{-3}$ and not more than $1 \times 10^{19}$ cm$^{-3}$, the luminous efficiency is improved and the driving voltage can be reduced. When the concentration of the n-type impurity is lower than $5 \times 10^{17}$ cm$^{-3}$ or higher than $1 \times 10^{19}$ cm$^{-3}$, the improvement in the luminous efficiency will be insufficient, or the reduction of the driving voltage will become insufficient.

Then, the concentration of then n-type impurity in the fourth portion layer WLH is not less than $5 \times 10^{17}$ cm$^{-3}$ and not more than $1 \times 10^{19}$ cm$^{-3}$ preferably, and not less than $1 \times 10^{18}$ cm$^{-3}$ and not more than $5 \times 10^{18}$ cm$^{-3}$ more preferably. By making the concentration of the n-type impurity in the fourth portion layer WLH not less than $5 \times 10^{17}$ cm$^{-3}$ and not more than $1 \times 10^{19}$ cm$^{-3}$, the luminous efficiency is improved and the driving voltage can be reduced. In particular, by making the concentration of the n-type impurity in the fourth portion layer WLH not less than $1 \times 10^{18}$ cm$^{-3}$ and not more than $5 \times 10^{18}$ cm$^{-3}$, the luminous efficiency is most improved and the driving voltage can be most reduced. When the concentration of the n-type impurity is lower than $5 \times 10^{17}$ cm$^{-3}$ or higher than $1 \times 10^{19}$ cm$^{-3}$, the improvement in the luminous efficiency will be insufficient, or the reduction of the driving voltage will become insufficient.

It is preferable that the thickness of the second portion layer BLH be made to be not less than the thickness of a monoatomic layer, and not more than the thickness of the first portion layer BLL. The thickness of the monoatomic layer is approximately 0.25 nm. When the thickness of the second portion layer BLH is less than that of the monoatomic layer, the effect of introducing impurities is low, and the effects of the reducing the driving voltage and the improvement of the luminous efficiency are small, for example. On the other hand, if the thickness of the second portion layer BLH exceeds that of the first portion layer BLL, the crystalline quality will become degraded, and the luminous efficiency will be reduced, for example.

It is preferable that the thickness of the fourth portion layer WLH be not less than that of the monoatomic layer, and not more than that of the third portion layer WLL. When the thickness of the fourth portion layer WLH is less than that of the monoatomic layer, the effect of introducing impurities is low, and the effects of the reducing the driving voltage and the improvement of the luminous efficiency are small, for example. On the other hand, if the thickness of the fourth portion layer WLH exceeds that of the third portion layer WLL, the crystalline quality will become degraded, and the luminous efficiency will be reduced, for example.

An n-type impurity contained in the second portion layer BLH and the fourth portion layer WLH is preferably at least one selected from the group consisting of Si, Ge, Sn and Te. By using these materials, with the good crystalline quality maintained, the carriers for improving characteristics can be generated efficiently, and the reduction of the driving voltage and the improvement of the luminous efficiency are performed effectively.

Hereinafter, reference examples will be described.

Figure 2B:
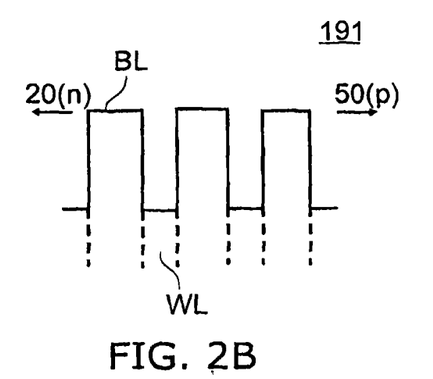

As shown in FIG. 2B, in a semiconductor light emitting device 191 of the first reference example, the barrier layer BL and well layer WL are not provided with the layer containing high concentration impurities.

Figure 2C:
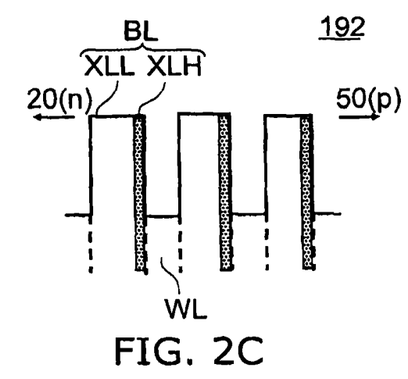

As shown in FIG. 2C, in a semiconductor light emitting device 192 of the second reference example, the barrier layer BL includes a high impurity concentration barrier layer XLH where the concentration of the impurity is high, and a low impurity concentration barrier layer XLL where the concentration of the impurity is low. Then, the high impurity concentration barrier layer XLH is disposed on the side of the p-type layer 50, and the low impurity concentration barrier layer XLL is disposed on the side of the n-type layer 20. A configuration of the barrier layer BL in the configuration is similar to that of the barrier layer BL in the semiconductor light emitting device 110 according to the embodiment. However, in the semiconductor light emitting device 192, the well layer WL does not include a layer which contains high concentration impurities.

Figure 2D:
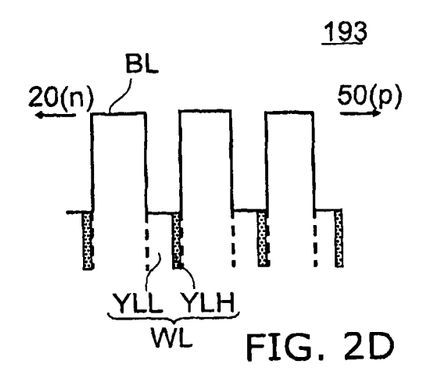

As shown in FIG. 2D, in a semiconductor light emitting device 193 of the third reference example, the well layer WL includes a high impurity concentration well layer YLH where the concentration of the impurity is high, and a low impurity concentration well layer YLL where the concentration of the n-type impurity is low. Then, the high impurity concentration well layer YLH is disposed on the side of the p-type layer 50, and the low impurity concentration well layer YLL is disposed on the side of the n-type layer 20. A configuration of the well layer WL in this configuration is similar to that of the well layer WL in the semiconductor light emitting device 110 according to the embodiment. However, in the semiconductor light emitting device 193, the barrier layer BL does not include a layer which contains high concentration impurities.

Figure 2E:
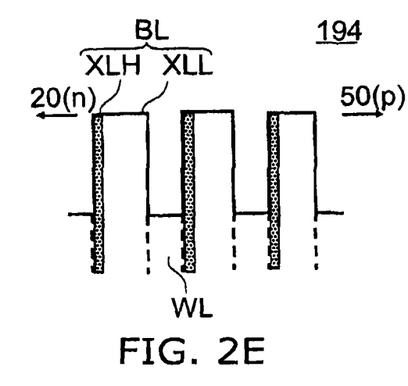

As shown in FIG. 2E, in a semiconductor light emitting device 194 of the fourth reference example, the barrier layer BL includes the high impurity concentration barrier layer XLH where the concentration of the n-type impurity is high and the low impurity concentration barrier layer XLL where the concentration of the n-type impurity is low. Then, the high impurity concentration barrier layer XLH is disposed on the side of the n-type layer 20, and the low impurity concentration barrier layer XLL is disposed on the side of the p-type layer 50. In this configuration, the arrangement of the high impurity concentration barrier layer XLH and the low impurity concentration barrier layer XLL is inversed to the case of the barrier layer BL in the semiconductor light emitting device 110 according to the embodiment.

Figure 2F:
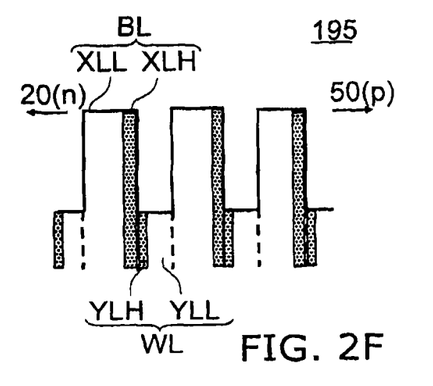

As shown in FIG. 2F, in a semiconductor light emitting device 195 of the fifth reference example, the configuration of the barrier layer BL is the same as that of the barrier layer BL in the second reference example, and the well layer WL includes the high impurity concentration well layer YLH and the low impurity concentration well layer YLL. Then, the high impurity concentration well layer YLH is disposed on the side of the n-type layer 20, and the low impurity concentration well layer YLL is disposed on the side of the p-type layer 50. In this configuration, the arrangement of the high impurity concentration well layer YLH and the low impurity concentration well layer YLL is inversed to the case of the well layer WL in the semiconductor light emitting device 110 according to the embodiment.

Figure 3A:
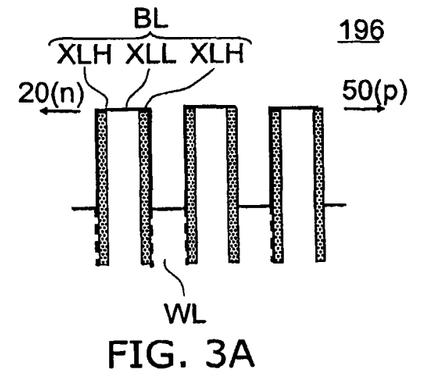
FIG. 3A to FIG. 3E are schematic views showing configurations of the semiconductor light emitting devices of reference examples.

As shown in FIG. 3A, in a semiconductor light emitting device 196 of the sixth reference example, the barrier layer BL includes two high impurity concentration barrier layers XLH and the low impurity concentration barrier layer XLL. Then, the high impurity concentration barrier layers XLH are disposed on the side of the n-type layer 20 and the p-type layer 50, and the low impurity concentration barrier layer XLL is disposed between them.

Figure 3B:
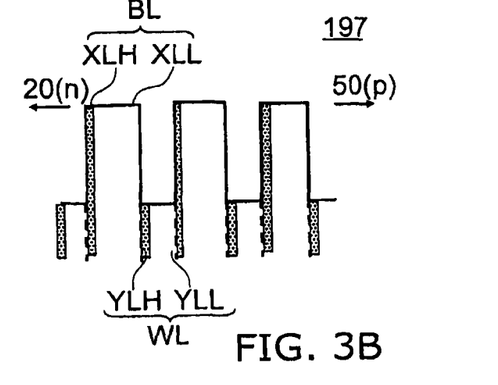

As shown in FIG. 3B, in a semiconductor light emitting device 197 of the seventh reference example, the barrier layer BL includes the high impurity concentration barrier layer XLH and the low impurity concentration barrier layer XLL, the high impurity concentration barrier layer XLH is disposed on the side of the n-type layer 20, and the low impurity concentration barrier layer XLL is disposed on the side of the p-type layer 50. Then, the well layer WL includes the high impurity concentration well layer YLH and the low impurity concentration well layer YLL, the high impurity concentration well layer YLH is disposed on the side of the n-type layer 20, and the low impurity concentration well layer YLL is disposed on the side of the p-type layer 50. The arrangement of the impurity region having the high impurity concentration in the barrier layer BL and well layer WL is inversed to the arrangement in the semiconductor light emitting device 110 according to the embodiment.

The semiconductor light emitting device 110 and the semiconductor light emitting devices 191 to 197 of the first to seventh reference examples were actually manufactured, and characteristics thereof have been evaluated, of which results will be described.

Figure 4A:
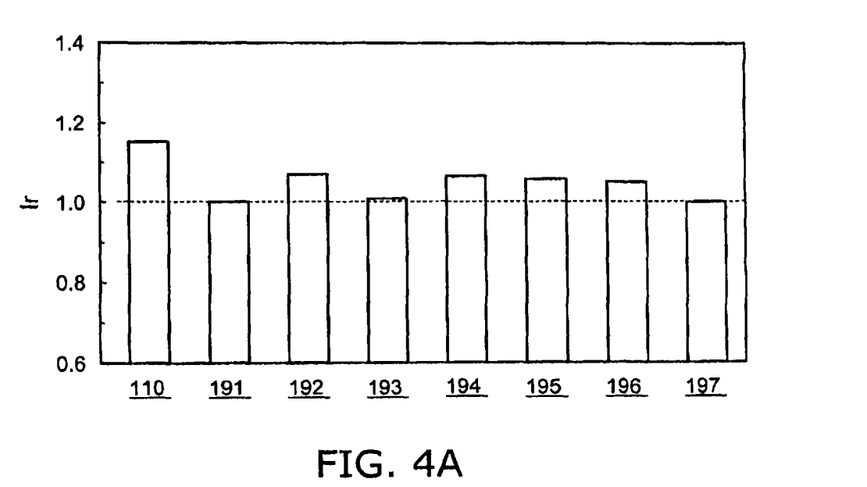
FIG. 4A and FIG. 4B are graphs showing characteristics of the semiconductor light emitting device according to the embodiment, and the semiconductor light emitting devices of the reference examples.
Figure 4B:
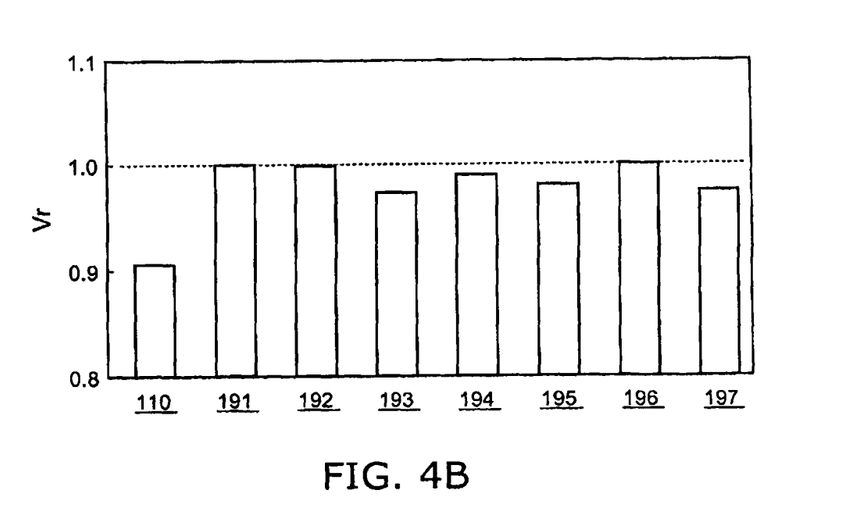

FIG. 4A and FIG. 4B are graphs illustrating characteristics of the semiconductor light emitting device according to the embodiment, and the semiconductor light emitting devices of the reference examples.

FIG. 4A shows the luminous efficiency in the case of providing the electric current of 20 mA. The vertical axis is a normalized luminous efficiency Ir where the luminous efficiency of the semiconductor light emitting device 191 of the first reference example is made as one. In measuring the luminous efficiency, an electric current of 20 mA was provided to each semiconductor light emitting device, and the emitted power output at that time was measured, and the luminous efficiency was calculated from the result. FIG. 4B shows a driving voltage with the driving current of 20 mA being provided. The vertical axis is a normalized driving voltage Vr where the driving voltage of the semiconductor light emitting device 191 of the first reference example is made as one.

As shown in FIG. 4A, the luminous efficiency (normalized luminous efficiency Ir) in the semiconductor light emitting device 110 according to the embodiment is higher than that of any of the reference examples.

As shown in FIG. 4B, the driving voltage (normalized driving voltage Vr) in the semiconductor light emitting device 110 according to the embodiment is lower than that of any of the reference examples.

In this way, the semiconductor light emitting device 110 according to the embodiment improves considerably the characteristics of both the luminous efficiency and the driving voltage.

On the other hand, in the semiconductor light emitting device 191 of the first reference example, the luminous efficiency is low and the driving voltage is high. This comes from the following. Since the impurity region having a high concentration is not provided in the barrier layer BL and the well layer WL, a polarization electric field is generated by symmetrical property of a crystal structure and crystal strain in the barrier layer BL and well layer WL. As a result, the energy bands of the barrier layer BL and well layer WL incline, and the carriers in the light emitting unit 40 are separated spatially.

In the semiconductor light emitting device 192 of the second reference example where the barrier layer BL has a configuration similar to that of the embodiment, the luminous efficiency is more than that of the semiconductor light emitting device 191 of the first reference example, and however, the degree of the improvement is low. The driving voltage is almost unchanged.

On the other hand, in the semiconductor light emitting device 193 of the third reference example where the well layer WL has a configuration similar to that of the embodiment, the driving voltage is more than that of the semiconductor light emitting device 191 of the first reference example, and however, the degree of the improvement is low. The luminous efficiency is almost unchanged.

In this way, in a method of providing an impurity region having a high concentration to either the barrier layer BL or the well layer WL, it is difficult to improve characteristics of both the luminous efficiency and the driving voltage.

Also in the semiconductor light emitting device 194 of the fourth reference example, although characteristics are better than the first reference example, the luminous efficiency is low and the driving voltage is high, as compared with the embodiment. This is caused by that, in the semiconductor light emitting device 194, the arrangement of the high impurity concentration barrier layer XLH and the low impurity concentration barrier layer XLL is inversed to that of the semiconductor light emitting device 110, the controllability of the impurity concentration is low, and the crystalline quality is degraded. The impurity tends to be excessively contained also in the low impurity concentration barrier layer XLL due to a residual impurity which remains in the reacting chamber. Accordingly, the steepness of the impurity concentration in the interface between the high impurity concentration barrier layer XLH and the low impurity concentration barrier layer XLL tends to be degraded, that is, the crystalline quality of the barrier layer BL tends to degrade. Accordingly, it is considered that, since the crystalline quality is degraded and suppression effect of the electric field is small as compared with the embodiment, the output became low and the driving voltage became high.

Also in the semiconductor light emitting device 195 of the fifth reference example, although characteristics are better than the first reference example, the luminous efficiency is low, and the driving voltage is high, as compared with the embodiment. This is caused by that, in the semiconductor light emitting device 195, the arrangement of the high impurity concentration well layer YLH and low impurity concentration well layer YLL of the well layer WL is inversed to that of the semiconductor light emitting device 110. In the configuration of the fifth reference example, in the case of switching from the high impurity concentration well layer YLH to the low impurity concentration well layer YLL in forming the well layer WL, changing the impurity concentration steeply is difficult in practice. The impurity is easy to be contained also in the low impurity concentration well layer YLL, and, for this reason, the crystalline quality is easy to degrade. Accordingly, it is considered that, since the crystalline quality is degraded, the luminous efficiency became low, and the driving voltage became high, as compared with the semiconductor light emitting device 110.

In the semiconductor light emitting device 196 of the sixth reference example, although the luminous efficiency is improved a little in contrast to the first reference example, the driving voltage is almost unchanged. It is considered that this is caused by that, in the semiconductor light emitting device 196, the low impurity concentration barrier layer XLL is disposed between two high impurity concentration barrier layers XLH, and, like the fourth reference example, the crystalline quality is degraded and the suppression effect of the electric field is small, as compared with the embodiment.

In the semiconductor light emitting device 197 of the seventh reference example, although the driving voltage is reduced a little in contrast to the first reference example, the luminous efficiency is almost unchanged. It is considered that this is caused by that, in the semiconductor light emitting device 197, the arrangement of the high impurity concentration barrier layer XLH and low impurity concentration barrier layer XLL of the barrier layer BL, as well as the arrangement of the high impurity concentration well layer YLH and low impurity concentration well layer YLL of the well layer WL, are inversed to the case of the semiconductor light emitting device 110, and the crystalline quality is degraded as compared with the embodiment.

In this way, the semiconductor light emitting device 110 according to the embodiment brings about the higher characteristics in both the luminous efficiency and the driving voltage than that in any of the reference examples described above.

Figure 3C:
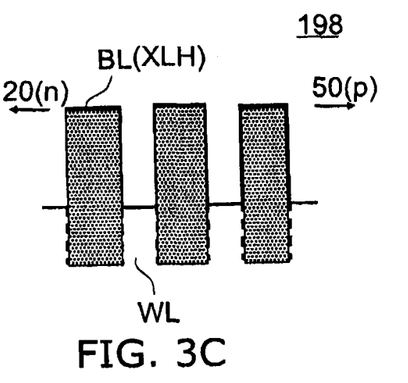

As shown in FIG. 3C, in the semiconductor light emitting device 198 of the eighth reference example, entire portion of the barrier layer BL is the high impurity concentration barrier layer XLH containing high concentration impurities. Si concentration in the high impurity concentration barrier layer XLH is not less than $5 \times 10^{17}$ cm$^{-3}$ and not more than $1 \times 10^{19}$ cm$^{-3}$, for example. In the case of this configuration, the driving voltage can be reduced more than in the semiconductor light emitting device 191 of the first reference example, but the crystalline quality becomes worse and the luminous efficiency is low.

Figure 3D:
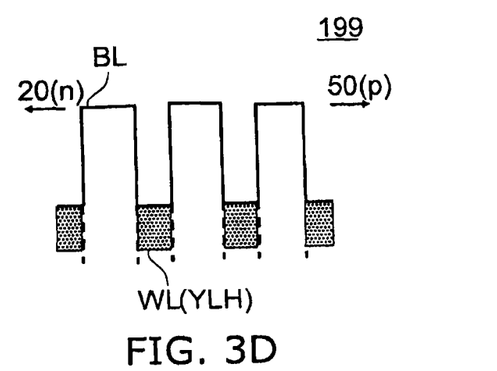

As shown in FIG. 3D, in the semiconductor light emitting device 199 of the ninth reference example, entire portion of the well layer WL is the high impurity concentration well layer YLH containing high concentration impurities. Si concentration in the high impurity concentration well layer YLH is not less than $5\times10^{17}$ cm$^{-3}$ and not more than $1\times10^{19}$ cm$^{-3}$, for example. Also in the case of this configuration, the driving voltage can be reduced more than that of the semiconductor light emitting device 191 of the first reference example, but the crystalline quality becomes worse remarkably and the luminous efficiency is low.

Figure 3E:
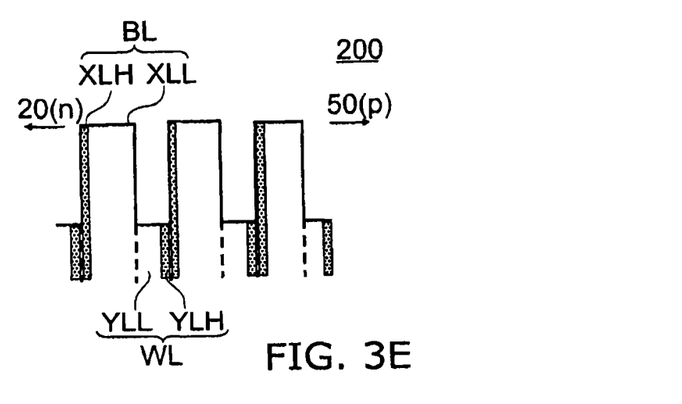

As shown in FIG. 3E, in the semiconductor light emitting device 200 of the tenth reference example, the configurations of both third and fourth reference examples are applied. Also in this case, since the arrangement of the high impurity concentration barrier layer XLH and the low impurity concentration barrier layer XLL is inversed to the case of the barrier layer BL in the semiconductor light emitting device 110 according to the embodiment, the controllability of the impurity concentration is bad, and the luminous efficiency is also low because the crystalline quality is degraded.

In this way, in the semiconductor light emitting device 110 according to the embodiment, by arranging, on the side of the p-type layer 50, the second portion layer BLH and fourth portion layer WLH which contain high concentration impurities, the driving voltage can be reduced more than in any reference examples, and the luminous efficiency can be improved more than in any reference examples.

FIG. 5 to FIG. 9 are schematic sectional views illustrating configurations of other semiconductor light emitting devices according to the embodiment.

Figure 5:
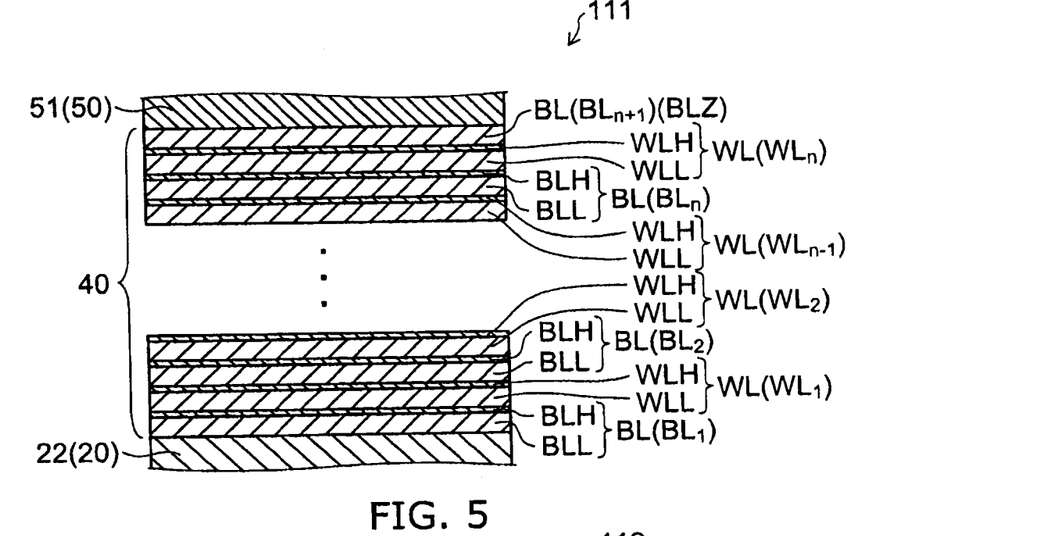
FIG. 5 is a schematic sectional view showing a configuration of other semiconductor light emitting device according to the embodiment.

As shown in FIG. 5, in another semiconductor light emitting device 111 according to the embodiment, the stacked structure of the first portion layer BLL and the second portion layer BLH is not provided in the final barrier layer BLZ nearest to the p-type layer 50, and the whole final barrier layer BLZ is a layer where the impurity concentration is low (for example, undoped layer). Other is the same as that of the semiconductor light emitting device 110.

In this way, a combination of the first portion layer BLL and the second portion layer BLH may not need to be provided to all of the barrier layer BL, and even only by being provided to a portion of the barrier layer BL, there is the effect, as described above, of the reduction of the driving voltage and the improvement of the efficiency.

Figure 6:
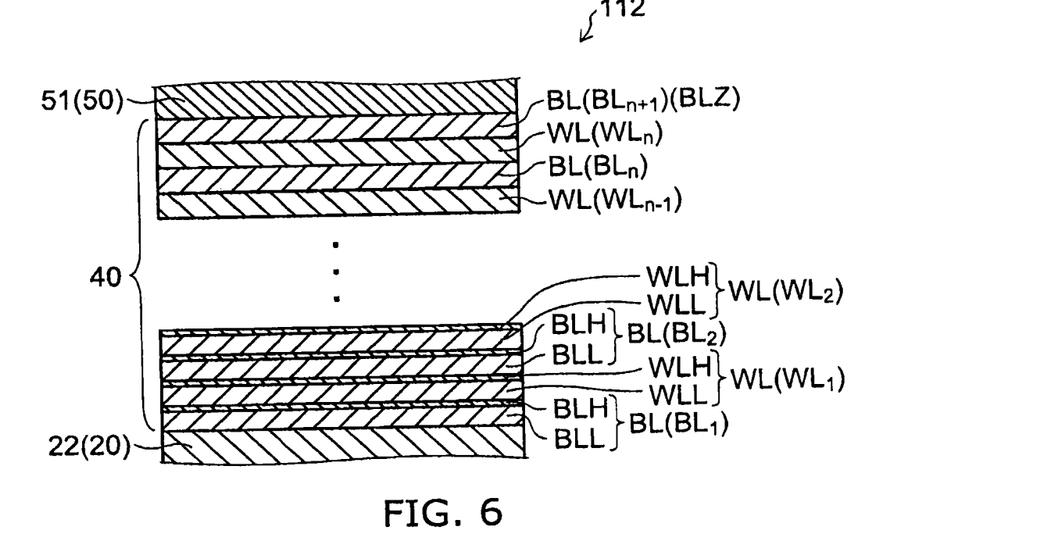
FIG. 6 is a schematic sectional view showing a configuration of other semiconductor light emitting device according to the embodiment.

As shown in FIG. 6, in a semiconductor light emitting device 112 according to the embodiment, although the barrier layer BL and the well layer WL which are near the n-type layer 20 have a combination of the first portion layer BLL and the second portion layer BLH, and a combination of the third portion layer WLL and the fourth portion layer WLH, respectively, a layer containing high concentration impurities is not provided to the barrier layer BL and the well layer WL near the p-type layer 50.

Figure 7:
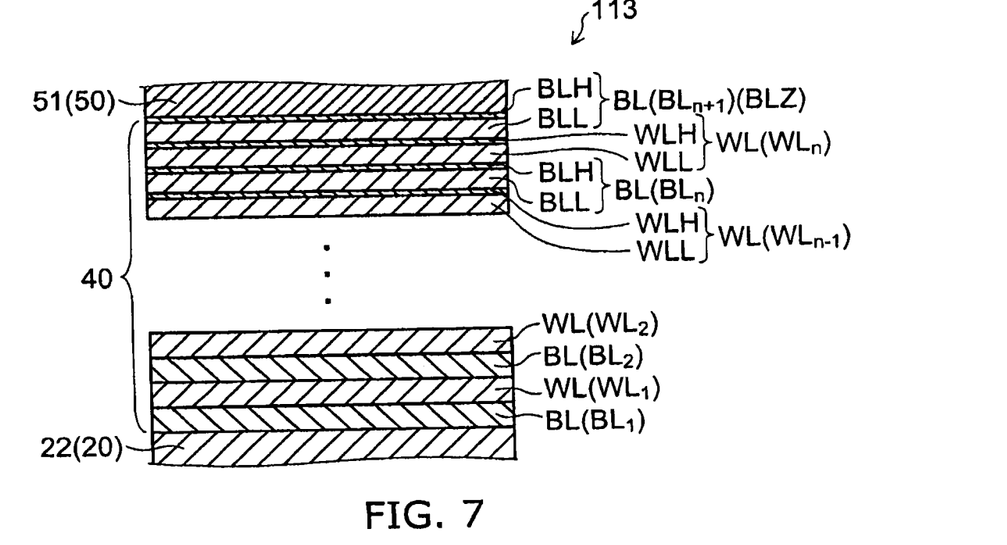
FIG. 7 is a schematic sectional view showing a configuration of other semiconductor light emitting device according to the embodiment.

As shown in FIG. 7, in a semiconductor light emitting device 113 according to the embodiment, although the barrier layer BL and the well layer WL which are near the p-type layer 50 have a combination of the first portion layer BLL and the second portion layer BLH, and a combination of the third portion layer WLL and the fourth portion layer WLH, respectively, the layer containing high concentration impurities is not provided to the barrier layer BL and the well layer WL near the n-type layer 20.

Figure 8:
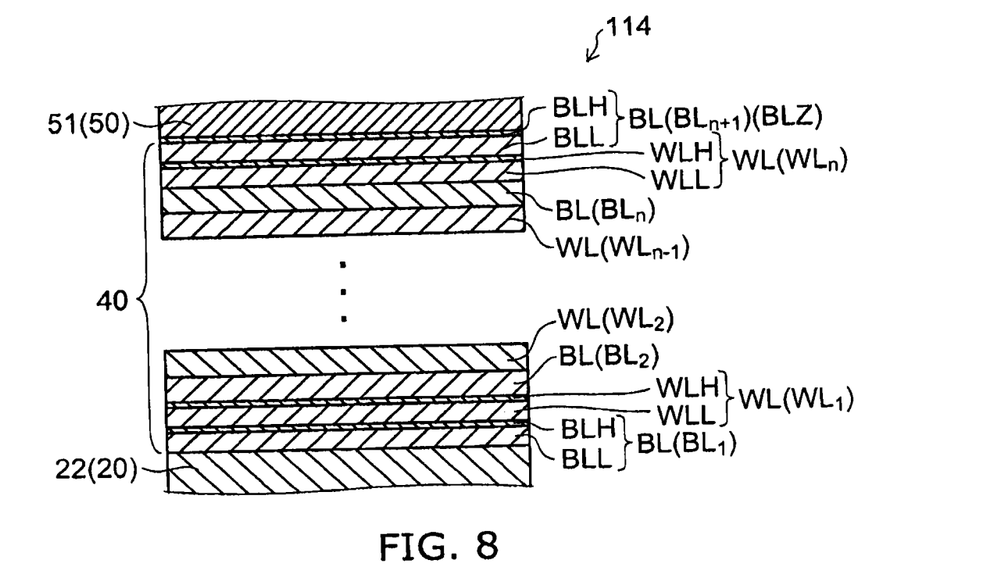
FIG. 8 is a schematic sectional view showing a configuration of other semiconductor light emitting device according to the embodiment.

As shown in FIG. 8, in a semiconductor light emitting device 114 according to the embodiment, although the barrier layer BL and the well layer WL which are near the n-type layer 20 and the p-type layer 50 have a combination of the first portion layer BLL and the second portion layer BLH, and a combination of the third portion layer WLL and the fourth portion layer WLH, respectively, in an intermediate part between the n-type layer 20 and the p-type layer 50, the layer containing high concentration impurities is not provided to the barrier layer BL and the well layer WL.

Figure 9:
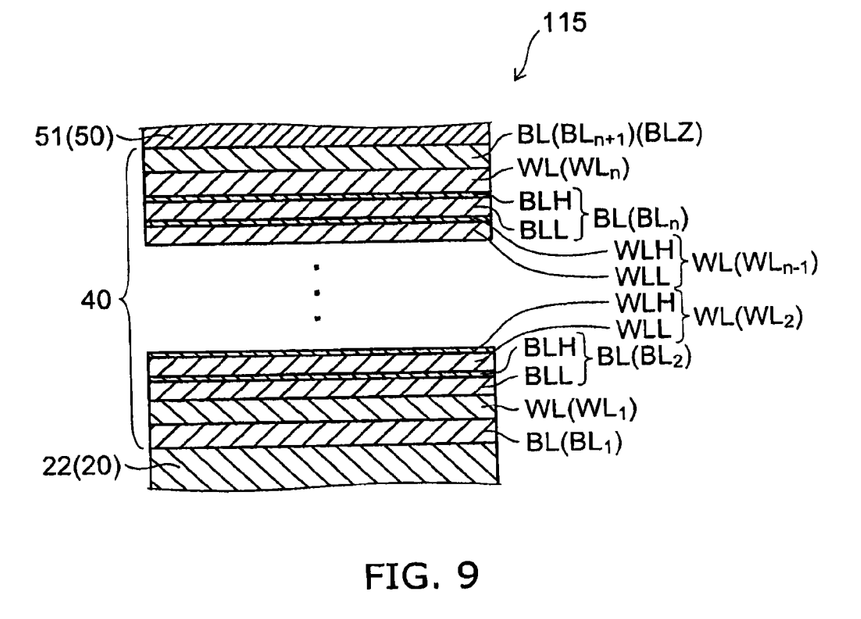
FIG. 9 is a schematic sectional view showing a configuration of other semiconductor light emitting device according to the embodiment.

As shown in FIG. 9, in a semiconductor light emitting device 115 according to the embodiment, although, in the intermediate part between the n-type layer 20 and the p-type layer 50, the barrier layer BL and the well layer WL have a combination of the first portion layer BLL and the second portion layer BLH, and a combination of the third portion layer WLL and the fourth portion layer WLH, respectively, the layer containing high concentration impurities is not provided to the barrier layer BL and the well layer WL near n-type layer 20 and p-type layer 50.

In this way, at least one of barrier layers BL may include the first portion layer BLL which is provided on the side of the n-type layer 20, and having a low n-type impurity concentration, and the second portion layer BLH which is provided on the side of the p-type layer 50, and contains n-type impurities with a concentration higher than the n-type impurity concentration in the first portion layer BLL, and at least one of well layers WL may include the third portion layer WLL which is provided on the side of the n-type layer 20, and having a n-type impurity concentration, and the fourth portion layer WLH which is provided on the side of the p-type layer 50, and contains n-type impurities with a concentration higher than the n-type impurity concentration in the third portion layer WLL.

In the case where a part of a plurality of the barrier layers BL has the first portion layer BLL and the second portion layer BLH, and a part of a plurality of the well layers WL has the third portion layer WLL and the fourth portion layer WLL, it is desirable that the barrier layer BL having the first portion layer BLL and the second portion layer BLH, and the well layer WL having the third portion layer WLL and the fourth portion layer WLH are adjacent with each other mutually. At least one of barrier layers BL (barrier layer BL which has the first portion layer BLL and the second portion layer BLH) are disposed next to at least one of well layers WL (well layer WL which has the third portion layer WLL and the fourth portion layer WLH.) Thereby, the internal electric fields generated in the barrier layer BL and the well layer WL can be efficiently suppressed by the carriers generated from impurities inside the second portion layer BLH and the fourth portion layer WLH which are the impurity regions having a high concentration.

Hereinafter, examples of the method for manufacturing the semiconductor light emitting device according to the embodiment will be described.

The manufacturing method according to the embodiment is a method for manufacturing the semiconductor light emitting device. The device includes the n-type layer 20 including the nitride semiconductor, the p-type layer 50 including the nitride semiconductor, and the light emitting unit 40 provided between the n-type layer 20 and the p-type layer 50. The light emitting unit 40 includes a plurality of barrier layers BL including the nitride semiconductor, and a plurality of well layers WL, each of the well layers being provided between the barrier layers BL, having the bandgap energy smaller than the bandgap energy in the barrier layer BL, and including the nitride semiconductor. At least one of the barrier layers BL includes the first portion layer BLL which is provided on the side of the n-type layer 20 and having a low n-type impurity concentration, and the second portion layer BLH which is provided on the side of the p-type layer 50 and contains n-type impurities with a concentration higher than the n-type impurity concentration in the first portion layer BLL. At least one of the well layers WL includes the third portion layer WLL which is provided on the side of the n-type layer 20 and having a low n-type impurity concentration, and the fourth portion layer WLH which is provided on the side of the p-type layer 50 and contains n-type impurities with a concentration higher than the n-type impurity concentration in the third portion layer WLL.

Figure 10:
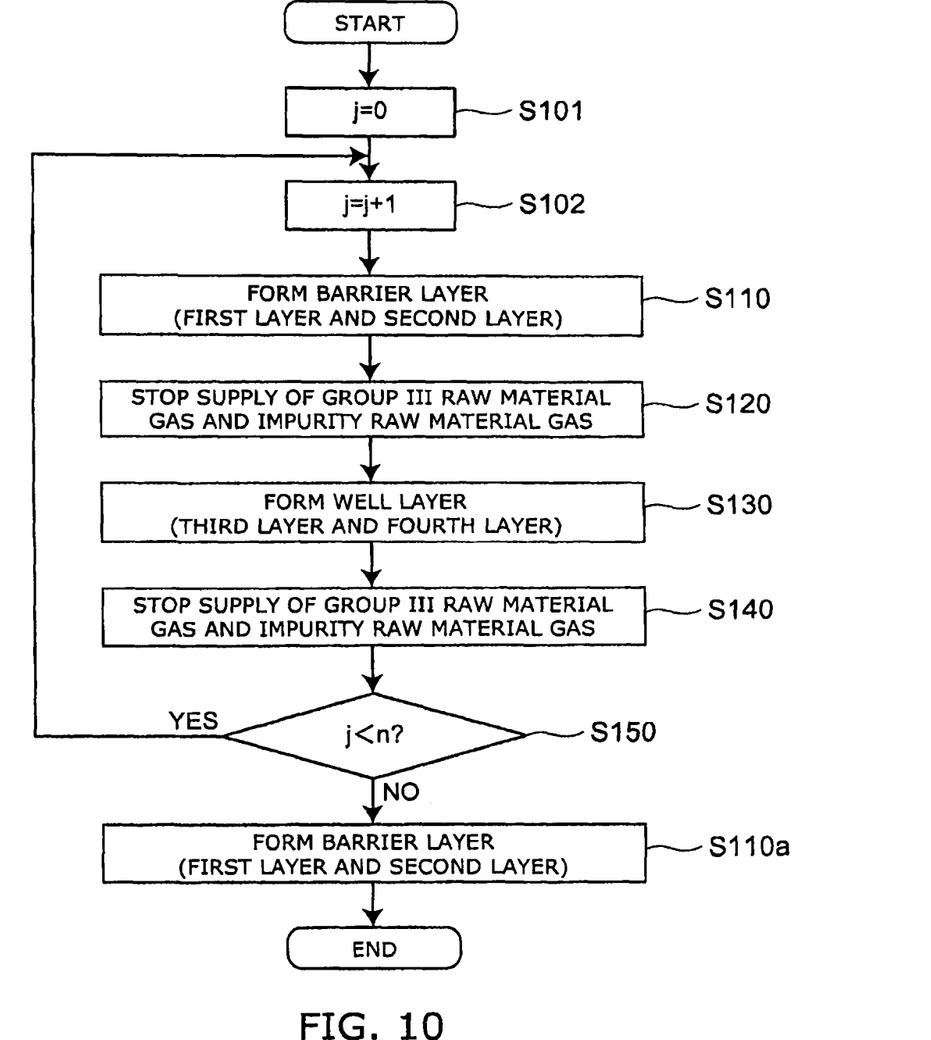
FIG. 10 is a flowchart showing a method for manufacturing the semiconductor light emitting device according to the embodiment.

FIG. 10 is a flowchart illustrating the method for manufacturing the semiconductor light emitting device according to the embodiment.

As shown in FIG. 10, in the method for manufacturing the semiconductor light emitting device according to the embodiment, in a processing chamber where the substrate on which the n-type layer 20 has been formed is disposed, group III raw material gas and group V raw material gas are introduced, and the first portion layer BLL is formed on the n-type layer 20, and thereafter, impurity raw material gas to be an n-type impurity is introduced further, and the second portion layer BLH is formed (step S110.)

As the group V raw material gas, $NH_3$ gas can be used, for example.

On the other hand, as the group III raw material gas, organic metal Ga compound gas such as $Ga(CH_3)_3$ or $Ga(C_2H_5)_3$, and organic metal In compound gas such as $In(CH_3)_3$ or $In(C_2H_5)_3$ can be used, for example. When the barrier layer BL and the well layer WL include Al, organic metal Al compound gas such as $Al(CH_3)_3$ or $Al(C_2H_5)_3$ can be used as the group III material, for example. In the case of using Si as an n-type impurity, Si hydride gas such as $SiH_4$ and organic Si compound gas such as $Si(CH_3)_4$ can be used as the impurity raw material gas.

Then, supplying of the group V raw material gas and the impurity raw material gas is stopped (step S120). For example, a period when only the group V raw material gas is introduced is provided. During this period, the impurity gas which remained in the processing chamber is fully exhausted, and is removed. Thereby, a state where the impurity gas does not remain substantially is formed in the processing chamber. When growth conditions (for example, the growth temperature etc.) of the barrier layer BL and the well layer WL are different, it is possible to change the growth conditions during this step S120.

Following this, the group III raw material gas and group V raw material gas are introduced, and the third portion layer WLL is formed on the barrier layer 20, and thereafter, the impurity raw material gas to be an n-type impurity is introduced further, and the fourth portion layer WLH is formed (step S130).

In step S130, a ratio of In in the group III raw material gas is raised more than in step S110, for example. Thereby, the bandgap energy of the well layer WL (the third portion layer WLL and the fourth portion layer WLH) can be made smaller than that of the barrier layer BL.

After that, supplying of the group III raw material gas and the impurity raw material gas is stopped (step S140).

When growth conditions (for example, the growth temperature etc.) of the barrier layer BL and the well layer WL are different, it is possible to change the growth conditions during this step S140.

Hereinafter, step S110 to step S140 described above are repeated.

However, in step S110 in the second time around or later, forming of the first portion layer BLL is performed on the fourth portion layer WLH.

In this repetition, an integer j is first set as "0" (step S101), and after that, the integer j is made to be the one with 1 added to the previous integer j (step S102), and step S110 to step S140 described above are carried out after that, for example. After that, the comparison of the integer j and stacking number n determined in advance is performed (step S150), and when the integer j is less than the stacking number n, the process returns to step S110 (in this case, to step 102), and the process described above is repeated.

Then, if the integer j reaches the stacking number n, the barrier layer BL (final barrier layer BLZ) is formed (step S110a). The group III raw material gas and the group V raw material gas are introduced, and the first portion layer BLL is formed on the fourth portion layer WLH, and thereafter, the impurity raw material gas to be an n-type impurity is introduced further, and the second portion layer BLH is formed.

In Step S110a, the group III raw material gas and the group V raw material gas are introduced, and the first portion layer BLL is formed on the fourth portion layer WLH, and if the impurity raw material gas to be an n-type impurity is not introduced, the final barrier layer BLZ will have a configuration having only a layer where the impurity concentration is low, and the semiconductor light emitting device 111 illustrated in FIG. 5 can be manufactured.

In the flowchart illustrated in FIG. 10, in a part of the repetition of step S110 to step S140, either of the forming of the second portion layer BLH and the fourth portion layer WLH can be omitted. Thereby, the semiconductor light emitting devices 112 to 115 illustrated in FIG. 6 to FIG. 9 and the modified semiconductor light emitting devices can be manufactured, for example.

Then, the forming of the p-type layer 50 and various electrodes described already and the division of devices are performed, and the semiconductor light emitting device according to the embodiment is manufactured. In the case of using Mg as the p-type impurity raw material, organic Mg compound gas such as $(C_5H_5)_2Mg$ and $(C_5H_4C_2H_5)_2$ Mg can be used as the impurity raw material gas.

In this way, on the n-type layer 20, using the gas including the group III raw material gas and the group V raw material gas, the manufacturing method according to the embodiment includes forming the first portion layer BLL having a low n-type impurity concentration, and forming, on the first portion layer BLL, the second portion layer BLH containing n-type impurities with a concentration higher than the n-type impurity concentration in the first portion layer BLL, to form one of the barrier layers BL. Furthermore, on the one of the barrier layers BL, using the gas including the group III raw material gas and the group V raw material gas, the manufacturing method includes forming the third portion layer WLL having a low n-type impurity concentration, and forming the fourth portion layer WLH containing n-type impurities with a concentration higher than the n-type impurity concentration in the third portion layer WLL on the third portion layer WLL, to form one of well layers WL.

Furthermore, the manufacturing method, between the formation of the above one of the barrier layers BL and the formation of the above one of the well layers WL, can include performing a first pause process where the group V raw material gas is introduced while the supply of the group III raw material gas is stopped.

The formation of the one of the barrier layers includes supplying an n-type impurity raw material gas, and the performing the first pause process includes stopping the supplying the n-type impurity raw material gas.

The manufacturing method can include forming, on the one of the well layers, another first portion layer which having a low n-type impurity concentration, using gas including group III raw material gas and group V raw material gas, and forming, on the another first portion layer, another second portion layer containing n-type impurities in a concentration higher than the n-type impurity concentration in the another first portion layer, to form another one of the barrier layers.

The manufacturing method can include performing a second pause process which introduces group V raw material gas while stopping supplying group III raw material gas between the forming the one of the well layers and the forming the another one of the barrier layers.

The forming the one of the well layers includes supplying an n-type impurity raw material gas, and the performing the second pause process includes stopping supplying the n-type impurity raw material gas.

In the above, the n-type impurity raw material gas contains at least one selected from the group consisting of Si, Ge, Sn and Te, for example.

In the manufacturing method, it is preferable that the thickness of the second portion layer BLH be not more than that of the first portion layer BLL. It is preferable that the thickness of the fourth portion layer WLH be not more than that of the third portion layer WLL.

In this way, the method for manufacturing the semiconductor light emitting device according to the embodiment includes; a first process which, in the processing chamber where the substrate 10 having the n-type layer 20 formed has been disposed, introduces the group III raw material gas and the group V raw material gas to form the first portion layer BLL, and thereafter, introduces further the impurity raw material gas to be an n-type impurity to form the second portion layer BLH; a second process which stops the supply of the group III raw material gas and the impurity raw material gas; a third process which introduces the group III raw material gas and the group V raw material gas to form the third portion layer WLL, and thereafter, introduces further the impurity raw material gas to form the fourth portion layer WLH; and a fourth process which stops the supply of the group III raw material gas and the impurity raw material gas. Then, the process can further include performing the first process to the fourth process described above repeatedly.

Accordingly, in the second process (step S120) and fourth process (step S140) described above, a state where the impurity gas does not remain substantially in the processing chamber is formed, and the impurity concentration in the first portion layer BLL and the third portion layer WLL can sufficiently be reduced, and as a result, the crystalline quality of the barrier layer BL and well layer WL can be improved and the semiconductor light emitting device having the low driving voltage and the high luminous efficiency can be manufactured.

The semiconductor light emitting device and the method for manufacturing the same according to the embodiment are applicable to a LED of which color is ultraviolet, blue-purple, blue, green, etc., and moreover, to a laser diode (LD: Laser Diode) of which color is blue-purple, blue, green.

According to the embodiment, the semiconductor light emitting device of the high luminous efficiency and the low driving voltage, and the manufacturing method thereof can be provided.

In the specification, "nitride semiconductor" includes all compositions of semiconductors of the chemical formula $B_x In_y Al_z Ga_{1-x-y-z} N$ ($0 \le x \le 1$, $0 \le y \le 1$, $0 \le z \le 1$, and $x+y+z \le 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

Hereinabove, exemplary embodiments of the invention are described with reference to specific examples. However, the invention is not limited to these specific examples. For example, with respect to specific configurations of each elements, such as the n-type layer, the p-type layer, the light emitting unit, the well layer, the barrier layer, the first portion layer to the fourth portion layer, the electrode, and the substrate, which constitutes the semiconductor light emitting device, such practice is included in the scope of the invention to the extent that one skilled in the art may similarly practice the invention by appropriately selecting from the known art, and similar effects thereto are obtained.

Further, any two or more components of the specific examples may be combined within the extent of technical feasibility and are included in the scope of the embodiments to the extent that the spirit of the embodiments is included.

Moreover, all semiconductor light emitting devices practicable by an appropriate design modification by one skilled in the art based on the semiconductor light emitting devices described above as embodiments of the invention also are within the scope of the invention to the extent that the purport of the embodiments of the invention is included.

Furthermore, various modifications and alterations within the spirit of the invention will be readily apparent to those skilled in the art.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor light emitting device, the method comprising:

forming a barrier layer on an n-type layer with a gas comprising a group III raw material gas and a group V raw material gas, by forming a first portion layer serving as a portion of the barrier layer and forming a second portion layer on the first portion layer, the second portion layer serving as another portion of the barrier layer and comprising an n-type impurity with a concentration higher than an n-type impurity concentration in the first portion layer; and forming a well layer on the barrier layer with a gas comprising a group III raw material gas and group V raw material gas, by forming a third portion layer serving as a portion of the well layer and forming a fourth portion layer on the third portion layer, the fourth portion layer serving as another portion of the well layer and comprising the n-type impurity with a concentration higher than an n-type impurity concentration in the third portion layer, wherein the device comprises the n-type layer comprising a nitride semiconductor, a p-type layer comprising a nitride semiconductor, and a stacked structure between the n-type layer and the p-type layer, the stacked structure comprises a plurality of barrier layers comprising the barrier layer, and a plurality of well layers comprising the well layer, the barrier layers comprise a nitride semiconductor, each of the well layers is between barrier layers, each of the well layers has a bandgap energy smaller than a bandgap energy of the barrier layers, and each of the well layers comprises a nitride semiconductor.

2. The method according to claim 1, further comprising stopping a supply of the group III raw material gas while introducing the group V raw material gas between the forming the barrier layer and the forming the well layer.

3. The method according to claim 2, wherein
the forming the barrier layer comprises supplying an n-type impurity raw material gas, and
the stopping comprises stopping a supply of an n-type impurity raw material gas.

4. The method according to claim 3, wherein the n-type impurity raw material gas comprises at least one selected from the group consisting of Si, Ge, Sn, and Te.

5. The method according to claim 1, further comprising forming a second barrier layer of the barrier layers on the well layer with a gas comprising group III raw material gas and group V raw material gas, by forming another first portion layer serving as a portion of the second barrier layer and forming another second portion layer on the another first portion layer, the another second portion layer serving as another portion of the second barrier layer and comprising an n-type impurity with a concentration higher than an n-type impurity concentration in the another first portion layer.

6. The method according to claim 5, further comprising stopping a supply of group III raw material gas while introducing group V raw material gas between the forming the well layer and forming the second barrier layer.

7. The method according to claim 6, wherein
the forming the well layer comprises supplying an n-type impurity raw material gas, and
the stopping comprises a supply of an n-type impurity raw material gas.

8. The method according to claim 7, wherein the n-type impurity raw material gas comprises at least one selected from the group consisting of Si, Ge, Sn, and Te.

9. The method according to claim 1, wherein a thickness of the second portion layer is not more than a thickness of the first portion layer.

10. The method according to claim 1, wherein a thickness of the fourth portion layer is not more than a thickness of the third portion layer.

11. The method according to claim 1, wherein the first portion layer has a first bandgap energy different from a second bandgap energy of the second portion layer.

12. The method according to claim 1, wherein at least one of the first bandgap energy and the second bandgap energy changes in a graded manner or in a step-wise manner.

13. The method according to claim 1, wherein:
the n-type impurity concentration in the second portion layer is not less than $5\times10^{17}$ cm$^{-3}$; and
the n-type impurity concentration in the fourth portion layer is not less than $5\times10^{17}$ cm$^{-3}$.

14. The method according to claim 13, wherein:
the n-type impurity concentration in the second portion layer is not more than $1\times10^{19}$ cm$^{-3}$; and
the n-type impurity concentration in the fourth portion layer is not more than $1\times10^{19}$ cm$^{-3}$.

15. The method according to claim 14, wherein:
the n-type impurity concentration in the first portion layer is not more than $1\times10^{17}$ cm$^{-3}$; and
the n-type impurity concentration in the third portion layer is not more than $1\times10^{17}$ cm$^{-3}$.

16. The method according to claim 15, wherein:
the n-type impurity concentration in the first portion layer is not less than $1\times10^{16}$ cm$^{-3}$; and
the n-type impurity concentration in the third portion layer is not less than $1\times10^{16}$ cm$^{-3}$.

17. The method according to claim 16, wherein a thickness of the second portion layer is not more than a thickness of the first portion layer.

18. The method according to claim 17, wherein a thickness of the fourth portion layer is not more than a thickness of the third portion layer.

19. The method according to claim 18, wherein the n-type impurity is at least one selected from the group consisting of Si, Ge, Sn, and Te.

* * * * *